US008595663B1

(12) United States Patent
Lu (10) Patent No.: US 8,595,663 B1
(45) Date of Patent: Nov. 26, 2013

(54) METHOD, SYSTEM, AND PROGRAM STORAGE DEVICE FOR MODELING CONTACT BAR RESISTANCE (71) Applicant: International Business Machines Corporation, Armonk, NY (US)

(72) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/689,832

(22) Filed: Nov. 30, 2012

(51) Int. Cl.
    G06F 17/50 (2006.01)
(52) U.S. Cl.
    USPC .......................................................... 716/110
(58) Field of Classification Search
    USPC .......................................................... 716/110
    See application file for complete search history.

(56) References Cited

U.S. PATENT DOCUMENTS

| | | | |
|---|---|---|---|
| 6,802,047 B1 | 10/2004 | Doniger | |
| 7,035,783 B2 | 4/2006 | Nagata et al. | |
| 7,421,383 B2 | 9/2008 | Hsiao et al. | |
| 8,469,724 B1* | 6/2013 | Barnette et al. | 439/86 |
| 2003/0230438 A1* | 12/2003 | Keefer et al. | 178/18.05 |
| 2005/0177334 A1 | 8/2005 | Hirano et al. | |
| 2009/0171644 A1 | 7/2009 | Chidambarrao et al. | |
| 2012/0226456 A1 | 9/2012 | Lu | |
| 2012/0227020 A1 | 9/2012 | Dewey, III et al. | |
| 2012/0254820 A1* | 10/2012 | Lu | 716/136 |

OTHER PUBLICATIONS

Ymeri, et al., "Distributed Inductance and Resistance Per Unit Length Formulas for VLSI Interconnects," International Microelectronics and Packaging Society, International Journal of Microcircuits and Electronic Packaging, vol. 24, No. 3, Third Quarter, 2001, pp. 210-216.

Walton, et al., "Numerical Simulation of Resistive Interconnects for Integrated Circuits," IEEE Journal of Solid-State Circuits, vol. Sc-20, No. 6, Dec. 1985, pp. 1252-1258.

Wang, et al., "Fast Extraction of 3-D Interconnect Resistance: Numerical-Analytical Coupling Method," IEEE, 2003, pp. 315-318.

IBM, "Method for the extraction of Effective Lateral Doping Profile and Source/Drain Parasitic Resistance Components from Semiconductor MOSFET Devices," IPCOM000138854D, Aug. 7, 2006, pp. 1-5.

Lu, et al., "Characterization, Simulation, and Modeling of FET Source/Drain Diffusion Resistance", IEEE 2008 Custom Integrated Circuits Conference, Proc. CICC, 2008, pp. 281-284.

International Application No. PCT/US13/57231, Filed Aug. 29, 2013, International Search Report and Written Opinion, Dated Sep. 19, 2013, 8 pages.

* cited by examiner

*Primary Examiner* — Suchin Parihar
(74) *Attorney, Agent, or Firm* — Gibb & Riley, LLC; Anthony J. Canale (57) ABSTRACT

Disclosed are embodiments for modeling the total resistance ($R_{tot}$) of a contact bar. In the embodiments, sections of the contact bar are demarcated depending upon the location of an additional interconnect structure, which is on the contact bar, and relative to a diffusion region, which is traversed and contacted by the contact bar. For each of the sections, section-specific current density boundary conditions are established, section-specific sheet current density expressions are developed, which assume that current flow is continuous in the normal direction relative to each boundary between any two adjacent sections and which satisfy both the section-specific current density boundary conditions and a stable current flow continuity equation, and a section-specific resistance expression is developed using the section-specific sheet current density expressions. Finally, the total resistance expression for the contact bar is developed by adding the section-specific resistance expressions for all of the sections.

25 Claims, 7 Drawing Sheets

METHOD, SYSTEM, AND PROGRAM STORAGE DEVICE FOR MODELING CONTACT BAR RESISTANCE

BACKGROUND

1. Field of the Invention

The embodiments disclosed herein relate to modeling parasitic resistances in integrated circuits and, more particularly, to embodiments of a method, a system and a program storage device for modeling the total contact resistance ($R_{tot}$) of a contact bar that electrically connects a plurality of semiconductor fins to an additional interconnect structure (e.g., another contact bar, a via or a via bar).

2. Description of the Related Art

Parasitic contact resistance is one of the larger parasitic resistances that will impact the performance of very large scale integration (VLSI) circuits, such as ring oscillators, logic gates (e.g., NAND gates, NOR gates, etc.), etc. Thus, during integrated circuit design, accurate modeling of the total resistance ($R_{tot}$) of contacts and contact bars is very important. Currently, the total resistance of a contact bar, which traverses and is electrically connected to a diffusion region of a planar field effect transistor (FET) or is electrically connected to multiple semiconductor fins of a multi-gate field effect transistor (MUGFET), is determined using an electromagnetic field solver (i.e., an electromagnetic solver), which outputs a numerical value for the total resistance. However, in compact models, a closed-form expression for the total resistance of each contact bar is required, as opposed to a numerical value. Therefore, there is a need in the art for an improved method for accurately modeling the total resistance of a contact bar using a closed-form expression.

SUMMARY

In view of the foregoing, disclosed herein are method, system and computer program product embodiments for accurately modeling the total resistance ($R_{tot}$) of a contact bar, which traverses a diffusion region. The contact bar can be electrically connected directly to the diffusion region (e.g., in the case of an integrated circuit with planar devices, such as planar field effect transistors (FETs)) or to each of multiple semiconductor fin within the diffusion region (e.g., in the case of an integrated circuit with non-planar devices, such as multi-gate field effect transistors (MUGFETs)) and can further be electrically connected to an additional interconnect structure, such as an additional contact bar or a via or via bar. Regardless of whether the contact bar is connected to the diffusion region itself or semiconductor fins within diffusion region, in the embodiments, a closed-form expression for the total resistance of a contact bar is developed for use in a compact model by first demarcating sections of the contact bar depending upon the location of the additional interconnect structure on the contact bar and relative to the diffusion region. Then, for each of the sections, section-specific current density boundary conditions are established, section-specific sheet current density expressions are developed, which satisfy both the section-specific current density boundary conditions and a stable current flow continuity equation, and a section-specific resistance expression is developed using the section-specific sheet current density expressions. Finally, the total resistance expression for the contact bar is developed by adding (i.e., summing) the section-specific resistance expressions for all of the sections and this total resistance ($R_{tot}$) expression can be used in a compact model.

More particularly, disclosed herein are embodiments of a computer-implemented method for accurately modeling the total resistance ($R_{tot}$) of a contact bar.

The modeling method can comprise accessing, by a computer from a memory, a design for an integrated circuit. In the design, the integrated circuit can incorporate planar devices (e.g., planar FETs) or non-planar devices (e.g., multi-gate field effect transistors (MUGFETs)). In any case, the integrated circuit can comprise a diffusion region and a contact bar can traverse the diffusion region. In the case of an integrated circuit with planar devices, the contact bar can be directly connected to the diffusion region. In the case of an integrated circuit with non-planar devices, the diffusion region can comprise multiple semiconductor fins and the contact bar can be electrically connected to the diffusion region at each of the semiconductor fins. In any case, an additional interconnect structure (e.g., another contact bar, a via, or a via bar) can be electrically connected to the contact bar.

Regardless of whether the contact bar is incorporated into an integrated circuit with planar devices or non-planar devices, the modeling method can further comprise developing, by the computer, a closed-form total resistance ($R_{tot}$) expression associated with the contact bar. This total resistance expression can be developed by first demarcating different sections of the contact bar based on the location, according to the design, of the additional interconnect structure on the contact bar and relative to the diffusion region. For example, when the contact bar extends laterally beyond the diffusion region and the additional interconnect structure (e.g., another contact bar electrically connecting the contact bar at issue to yet another contact bar, a via or a via bar) lands on the contact bar outside the diffusion region, the demarcated sections can comprise a first section within the diffusion region and a second section outside the diffusion region. However, when the additional interconnect structure (e.g., a via or via bar) lands on the contact bar within the diffusion region, the demarcated sections can comprise a first section on a first side of the additional interconnect structure, a second section on a second side of the additional interconnect structure opposite the first side, a third section below the additional interconnect structure and positioned laterally adjacent to the first section, and a fourth section below the additional interconnect structure and positioned laterally between the third section and the second section. After the sections of the contact bar are demarcated, the following process steps can be performed with regard to each of the sections. Section-specific current density boundary conditions can be established. Then, section-specific sheet current density expressions, which satisfy both the section-specific current density boundary conditions and a stable current flow continuity equation, can be developed. Finally, a section-specific resistance expression can be developed using the section-specific sheet current density expressions. The total resistance expression for the contact bar can then be developed using the section-specific resistance expression for each of the sections and this total resistance expression can be used in a compact model.

Also disclosed herein are modeling system embodiments associated with the above-described method embodiments for accurately modeling the total resistance ($R_{tot}$) of a contact bar.

The modeling system can comprise a memory that stores a design for an integrated circuit. In the design, the integrated circuit can incorporate planar devices (e.g., planar FETs) or non-planar devices (e.g., multi-gate field effect transistors (MUGFETs)). In any case, the integrated circuit can comprise a diffusion region and a contact bar can traverse the diffusion region. In the case of an integrated circuit with planar devices, the contact bar can be directly connected to the diffusion region. In the case of an integrated circuit with non-planar devices, the diffusion region can comprise multiple semiconductor fins and the contact bar can be electrically connected to the diffusion region at each of the semiconductor fins. In any case, an additional interconnect structure (e.g., another contact bar, a via, or a via bar) can be electrically connected to the contact bar.

The modeling system can further comprise at least one processor that accesses the design of the integrated circuit and, regardless of whether the contact bar in incorporated into an integrated circuit with planar devices or non-planar devices develops a closed-form total resistance ($R_{tot}$) expression associated with the contact bar using the same technique. The processor can develop this total resistance expression by first demarcating different sections of the contact bar based on the location, according to the design, of the additional interconnect structure on the contact bar and relative to the diffusion region. For example, when the contact bar extends laterally beyond the diffusion region and the additional interconnect structure (e.g., another contact bar electrically connecting the contact bar at issue to yet another contact bar, a via or a via bar) lands on the contact bar outside the diffusion region, the demarcated sections can comprise a first section within the diffusion region and a second section outside the diffusion region. However, when the additional interconnect structure (e.g., a via or via bar) lands on the contact bar within the diffusion region, the demarcated sections can comprise a first section on a first side of the additional interconnect structure, a second section on a second side of the additional interconnect structure opposite the first side, a third section below the additional interconnect structure and positioned laterally adjacent to the first section, and a fourth section below the additional interconnect structure and positioned laterally between the third section and the second section. After the sections of the contact bar are demarcated, the processor can perform the following process steps with regard to each of the sections: establish section-specific current density boundary conditions; develop section-specific sheet current density expressions, which satisfy both the section-specific current density boundary conditions and a stable current flow continuity equation, and develop a section-specific resistance expression using the section-specific sheet current density expressions. Finally, the processor can develop the total resistance expression for the contact bar using the section-specific resistance expression for each of the sections and this total resistance expression can be used in a compact model.

Also disclosed herein are computer program product embodiments associated with the above-described method embodiments for accurately modeling the total resistance ($R_{tot}$) of a contact bar. Specifically, each computer program product embodiment can comprise a computer readable storage medium having program code embodied therewith. The program code can be executable by a computer to perform any of the above-described modeling method embodiments.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, parasitic contact resistance is one of the larger parasitic resistances that will impact the performance of very large scale integration (VLSI) circuits, such as ring oscillators, logic gates (e.g., NAND gates, NOR gates, etc.), etc. Thus, during integrated circuit design, accurate modeling of the total resistance ($R_{tot}$) of contacts and contact bars is very important. Currently, the total resistance of a contact bar, which traverses and is electrically connected to a diffusion region of a planar field effect transistor (FET) or is electrically connected to multiple semiconductor fins (e.g., of multi-gate field effect transistors (MUGFETs), is determined using an electromagnetic field solver (i.e., an electromagnetic solver), which outputs a numerical value for the total resistance. However, in compact models, a closed-form expression for the total resistance of each contact bar is required, as opposed to a numerical value.

In view of the foregoing, disclosed herein are method, system and computer program product embodiments for accurately modeling the total resistance ($R_{tot}$) of a contact bar, which traverses a diffusion region. The contact bar can be electrically connected directly to the diffusion region (e.g., in the case of an integrated circuit with planar devices, such as planar field effect transistors (FETs)) or to each of multiple semiconductor fin within the diffusion region (e.g., in the case of an integrated circuit with non-planar devices, such as multi-gate field effect transistors (MUGFETs)) and can further be electrically connected to an additional interconnect structure, such as an additional contact bar or a via or via bar. Regardless of whether the contact bar is connected to the diffusion region itself or semiconductor fins within diffusion region, in the embodiments, a closed-form expression for the total resistance of a contact bar is developed for use in a compact model by first demarcating sections of the contact bar depending upon the location of the additional interconnect structure on the contact bar and relative to the diffusion region. Then, for each of the sections, section-specific current density boundary conditions are established, section-specific sheet current density expressions are developed, which assume that current flow is continuous in the normal direction relative to each boundary between any two adjacent sections and which satisfy both the section-specific current density boundary conditions and a stable current flow continuity equation, and a section-specific resistance expression is developed using the section-specific sheet current density expressions. Finally, the total resistance expression for the contact bar is developed by adding (i.e., summing) the section-specific resistance expressions for all of the sections and this total resistance expression can be used in a compact model.

Figure 1:
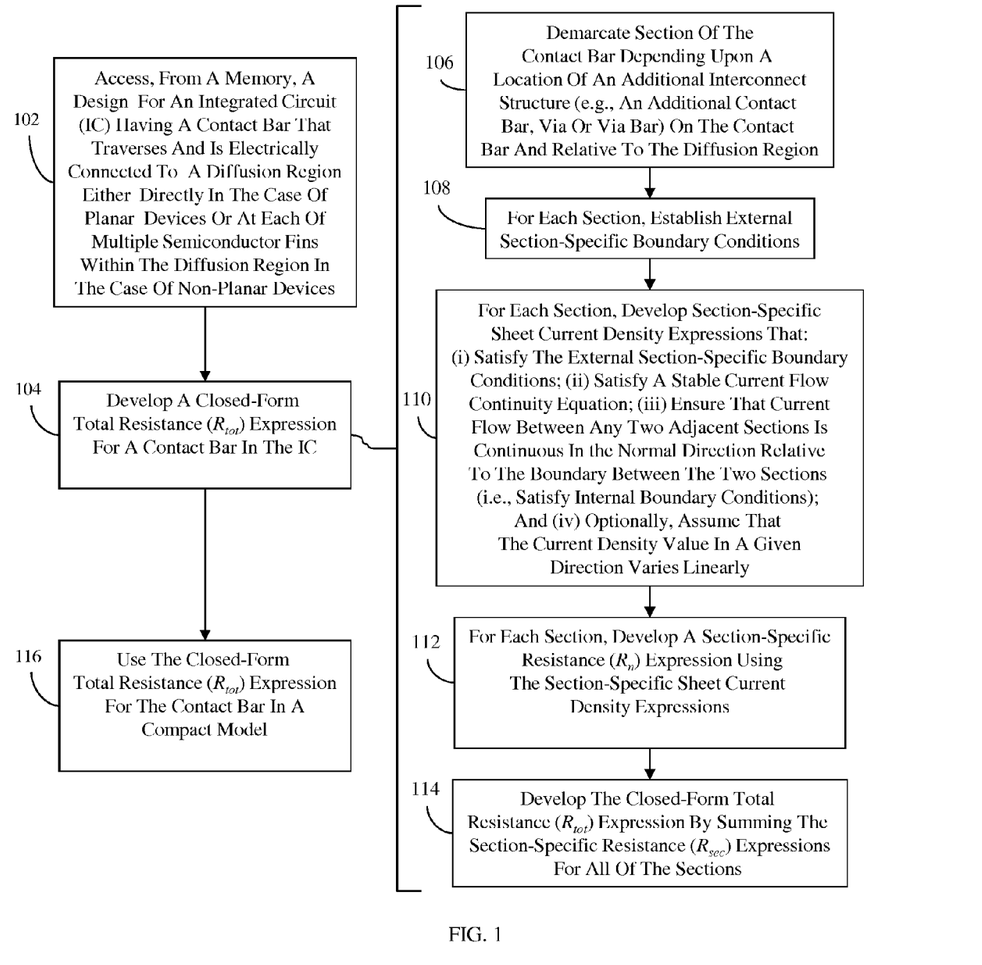
FIG. 1 is a flow diagram illustrating embodiments of a method for accurately modeling the total resistance ($R_{tot}$) of a contact bar.

More particularly, referring to FIG. 1, disclosed herein are computer-implemented method embodiments for accurately modeling the total resistance ($R_{tot}$) of a contact bar, which traverses and is electrically connected to a diffusion region and which is further electrically connected to an additional interconnect structure, such as an additional contact bar or a via or via bar.

Figure 2A:
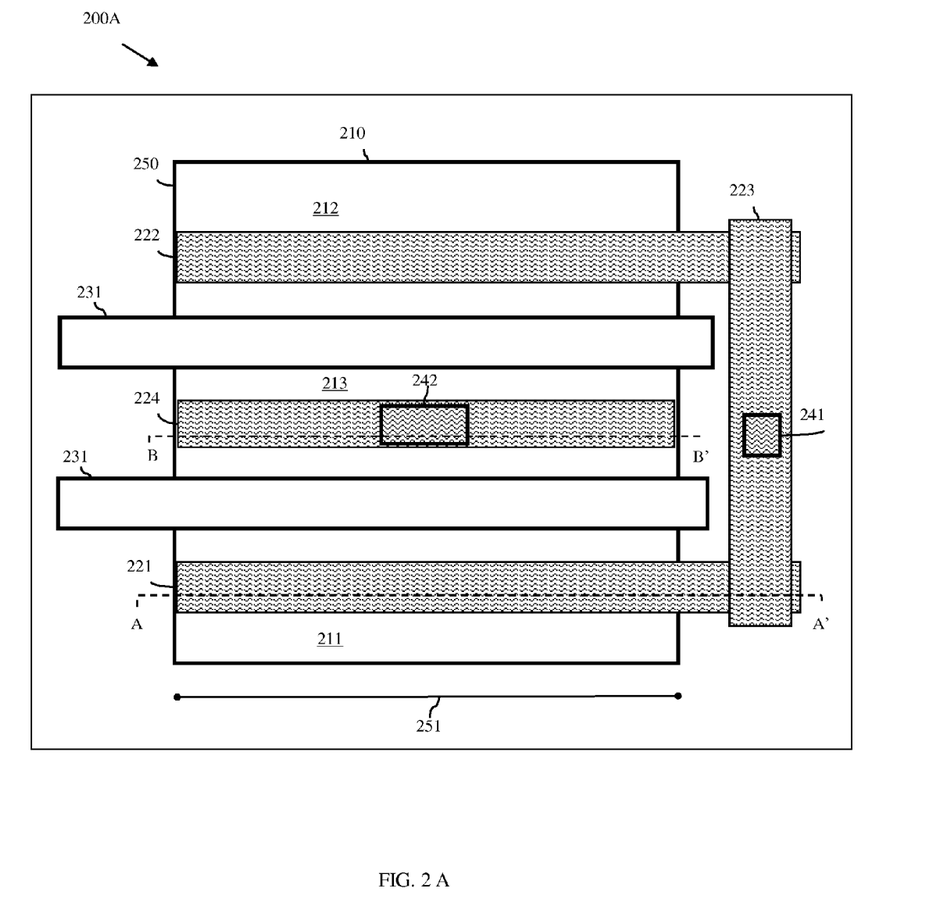
FIG. 2A is a top view diagram illustrating an exemplary integrated circuit with planar devices and having contact bar(s) that can be modeled according to the method of FIG. 1.
Figure 2B:
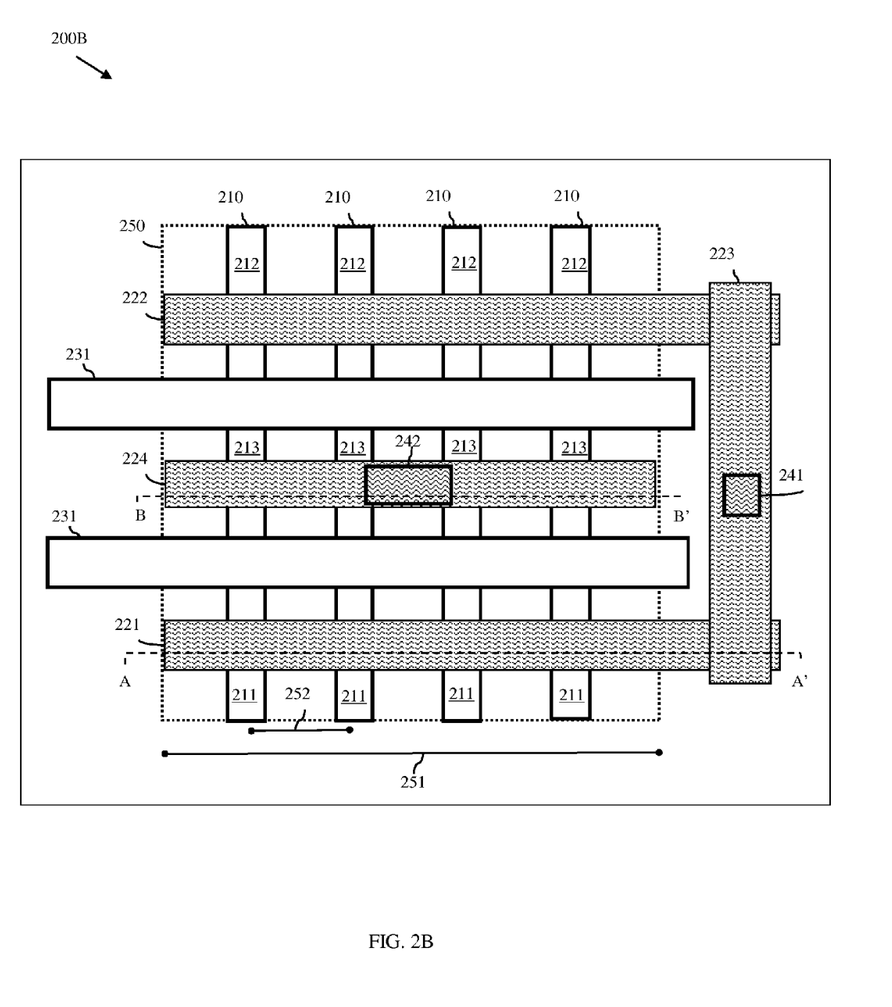
FIG. 2B is a top view diagram illustrating an exemplary integrated circuit with non-planar devices and having contact bar(s) that can be modeled according to the method of FIG. 1.

This method can comprise accessing, by a computer from a memory, a design for an integrated circuit, such as the exemplary integrated circuit 200A with planar devices, as illustrated in FIG. 2A and described in detail below, or the exemplary integrated circuit 200B with non-planar devices, as illustrated in FIG. 2B and described in detail below (102).

FIG. 2A is a top view diagram illustrating an exemplary integrated circuit 200A with planar devices. Specifically, this integrated circuit 200A can comprise multiple planar field effect transistors (FETs) with a shared diffusion region 250 (also referred to herein as an active device region).

Gate structures 231 can traverse the diffusion region 250 and can define the planar FET channel regions contained therein. Each gate structure 231 and, thereby each channel region, can be positioned laterally between corresponding source/drain regions 211, 212, 213 within the diffusion region 250.

A first contact bar 221 can be parallel to the gate structures 231 and can traverse and be electrically connected to first source regions 211 at one end of the diffusion region 250. Similarly, a second contact bar 222 can be parallel to the gate structures 231 and the first contact bar 221 and can traverse and be electrically connected to second source regions 212 the opposite end of the diffusion region 250. The first and second contact bars 221, 222 can each extend laterally beyond the diffusion region 250 and a third contact bar 223 can electrically connect the first and second contact bars 221, 222 outside the diffusion region 250. A via or via bar 241 can land on (i.e., can be located on, can be positioned on, can be electrically connected to, etc.) the third contact bar 223 and can electrically connect the third contact bar 223 and, thereby the first and second contact bars 221, 222, to a metal wiring layer above (not shown). Additionally, a fourth contact bar 224 can be parallel to the gate structures 231 (e.g., positioned laterally between the gate structures 131) and can traverse and be electrically connected to drain regions 213 at the center of the diffusion region 250. Another via or via bar 242 can land on (i.e., can be located on, can be positioned on, can be electrically connected to, etc.) the fourth contact bar 224 within the diffusion region 250 and can electrically connect that fourth contact bar 224 to a metal wiring layer above (not shown).

FIG. 2B is a top view diagram illustrating the exemplary integrated circuit 200B with non-planar devices. Specifically, this integrated circuit 200B can comprise multiple multi-gate field effect transistors (MUGFETs) comprising a diffusion region 250 (also referred to herein an active semiconductor device region) comprising a plurality of semiconductor fins 210. The diffusion region 250 can have a width 251 equal to the fin pitch 252 (i.e., the spacing of the semiconductor fins 210, as measured from the center of one semiconductor fin to the center of an adjacent semiconductor fin) multiplied by the total number of semiconductor fins 210 (e.g., four, as illustrated).

Gate structures 231 can traverse the diffusion region 250 and can define MUGFET channel regions within each of the semiconductor fins 210. Each gate structure 231 and, thereby each channel region, can be positioned laterally between corresponding MUGFET source/drain regions 211, 212, 213 also within each of the semiconductor fins 210.

A first contact bar 221 can be parallel to the gate structures 231 and can traverse and be electrically connected to the diffusion region 250 and, particularly, to first source regions 211 in each of the semiconductor fins 210 at one end of the diffusion region 250. Similarly, a second contact bar 222 can be parallel to the gate structures 231 and the first contact bar 221 and can traverse and be electrically connected to the diffusion region 250 and, particularly, to second source regions 212 in each of the semiconductor fins 210 at the opposite end of the diffusion region 250. The first and second contact bars 221, 222 can each extend laterally beyond the diffusion region 250 and a third contact bar 223 can electrically connect the first and second contact bars 221, 222 outside the diffusion region 250. A via or via bar 241 can land on (i.e., can be located on, can be positioned on, can be electrically connected to, etc.) the third contact bar 223 and can electrically connect the third contact bar 223 and, thereby the first and second contact bars 221, 222, to a metal wiring layer above (not shown). Additionally, a fourth contact bar 224 can be parallel to the gate structures 231 (e.g., positioned laterally between the gate structures 231) and can traverse and be electrically connected to the diffusion region 250 and, particularly, to drain regions 213 in each of the semiconductor fins 210 at the center of the diffusion region 250. Another via or via bar 242 can land on (i.e., can be located on, can be positioned on, can be electrically connected to, etc.) the fourth contact bar 224 within the diffusion region 250 and can electrically connect that fourth contact bar 224 to a metal wiring layer above (not shown).

Figure 3:
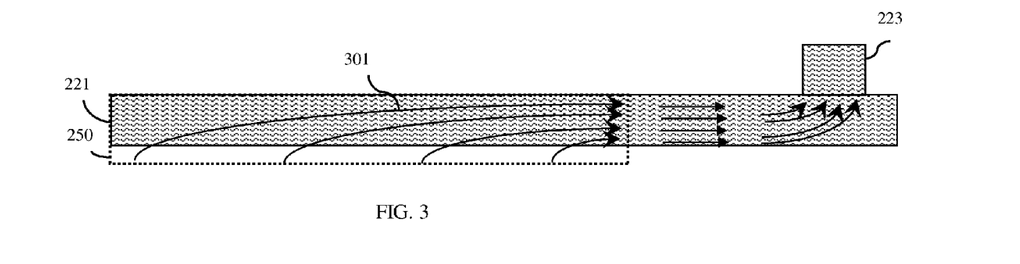
FIG. 3 is a cross-section diagram illustrating electric current (I) flow through the contact bar 221 of the integrated circuit of FIG. 2A or the integrated circuit of FIG. 2B.
Figure 4:
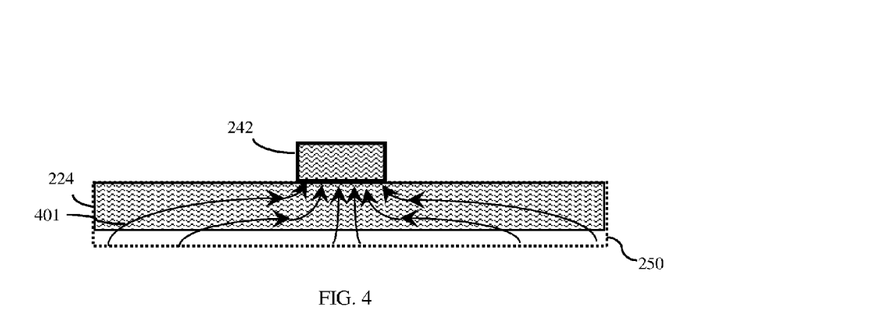
FIG. 4 is a cross-section diagram illustrating electric current (I) flow through the contact bar 224 of the integrated circuit of FIG. 2A or the integrated circuit of FIG. 2B.

The modeling method can further comprise developing, by the computer, a closed-form total resistance ($R_{tot}$) expression associated with any one or more of the contact bars 221-224 in that are incorporated into the integrated circuit 200A of FIG. 2A or 200B of FIG. 2B (104). Those skilled in the art will recognize that electric current (I) is inversely proportional to resistance (R) at a fixed voltage (V) (i.e., R=V/I). Furthermore, electric current (I) flow through each contact bar will vary depending upon the location of any additional interconnect structure on the contact bar and relative to the diffusion region 250. For example, FIGS. 3 and 4 illustrate the differences in electric current (I) flow through the first contact bar 221 and the fourth contact bar 224, respectively, of the exemplary integrated circuit 200 of FIG. 1. As shown in FIG. 3, an additional interconnect structure (namely, the third contact bar 223) lands on the first contact bar 221 outside the diffusion region 250. In this case, the electric current (I) 301 enters the first contact bar 221 only from the portion within the diffusion region 250 and then turns towards the portion that is outside the diffusion region 250 and contacted by the third contact bar 223. However, as shown in FIG. 4, the fourth contact bar 224 is contained within the diffusion region 250 and is contacted by an additional interconnect structure (namely, the via or via bar 242) within the diffusion region 250. In this case, the electric current (I) 401 enters the fourth contact bar 224 across its entire length, which is within the diffusion region 250, and, depending upon where it enters, it either turns right towards the additional interconnect structure 242, turns left towards the additional interconnect structure 242, or moves directly upwards towards the additional interconnect structure 242. In light of the relationship between electric current (I) and resistance (R) as well as the changes in electric current (I) flow through a contact bar as a function of the location on the contact bar of an additional interconnect structure relative to the diffusion region, the embodiments disclosed provide the following process steps for developing a closed-form total resistance expression associated with a contact bar at process 104.

Figure 5:
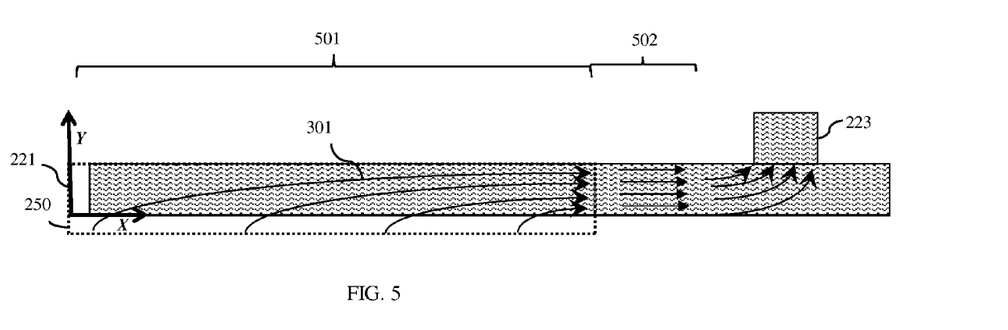
FIG. 5 is a cross-section diagram illustrating demarcation of sections in the contact bar 221 of the integrated circuit of FIG. 2A or the integrated circuit of FIG. 2B.
Figure 6:
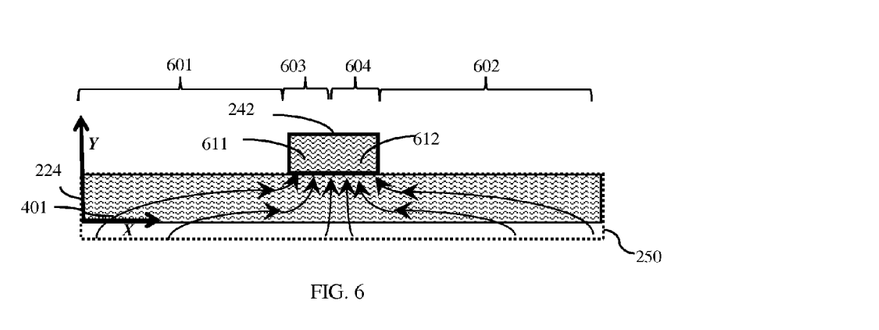
FIG. 6 is a cross-section diagram illustrating demarcations of section in the contact bar 224 of the integrated circuit of FIG. 2A or the integrated circuit of FIG. 2B.

First different sections of the contact bar at issue can be demarcated (i.e., defined, delineated, etc.) based on the location, according to the design, of any additional interconnect structures on the contact bar and relative to the diffusion region 250 (i.e., inside or outside the diffusion region) because, as mentioned above, this location will impact electric current (I) flow through the contact bar and, thereby will impact resistance (106). For example, as illustrated in FIG. 5, when the contact bar (e.g., the first contact bar 221 of FIG. 2) extends laterally beyond the diffusion region 250 and the additional interconnect structure 223 (e.g., another contact bar electrically connecting the contact bar at issue to yet another contact bar, a via or a via bar) lands on the contact bar 221 outside the diffusion region 250, the demarcated sections can comprise a first section 501 within the diffusion region 250 and a second section 502 outside the diffusion region 250. The sections 501-502 are demarcated because all electric current (I) flows into the first section 501 from the diffusion region 250 and turns in the same direction towards the additional interconnect structure 223 and all electric current (I) flows into the second section 502 from the first section 501 and out the additional interconnect structure 223. However, as illustrated in FIG. 6, when the additional interconnect structure 242 (e.g., a via or via bar) lands on the contact bar (e.g., the fourth contact bar 224 of FIG. 2) within the diffusion region 250, the demarcated sections can comprise a first section 601 on a first side 611 of the additional interconnect structure 242, a second section 602 on a second side 612 of the additional interconnect structure 242 opposite the first side 611, a third section 603 below additional interconnect structure 242 and positioned laterally adjacent to the first section 601, and a fourth section 604 below the additional interconnect structure 242 and positioned laterally between the third section 603 and the second section 602. The sections 601-604 are demarcated because electric current (I) flows into the first section 601 from the diffusion region 250 and turns in one direction towards the additional interconnect structure 242, electric current (I) flows into the second section 602 from the diffusion region 250 and turns in the opposite direction towards the additional interconnect structure 242, electric current (I) flows into the third section 603 from both the first section 601 and the diffusion region 250 and then out the additional interconnect structure 242, and electric current (I) flows into the fourth section 604 from both the second section 602 and the diffusion region 250 and then out the additional interconnect structure 242.

Figure 7:
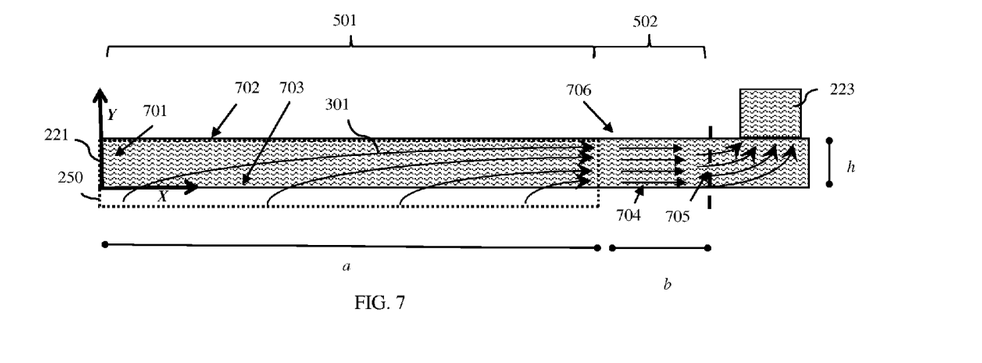
FIG. 7 is a cross-section diagram illustrating additional processes performed with respect to the contact bar 221 of the integrated circuit of FIG. 2A or the integrated circuit of FIG. 2B.
Figure 8:
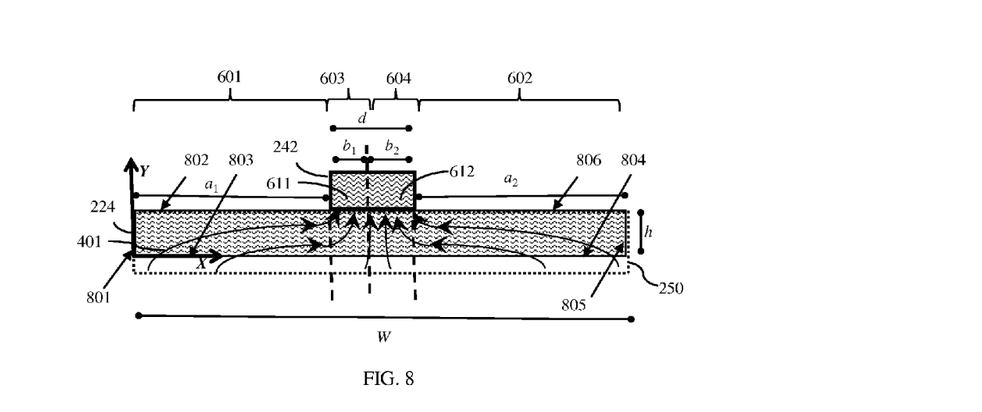
FIG. 8 is a cross-section diagram illustrating the same additional processes performed with respect to the contact bar 224 of the integrated circuit of FIG. 2A or the integrated circuit of FIG. 2B.

After the sections of the contact bar are demarcated at process 106, additional process steps 108-112 can be performed with regard to each of the sections of a contact bar at issue (e.g., with regard to the sections 501-502 of the first contact bar 221 as shown in FIG. 7 or with regard to sections 601-604 of the fourth contact bar 224 as shown in FIG. 8).

Specifically, external section-specific current density boundary conditions can be established at least in the x direction and y direction (108).

Next, section-specific sheet current density (j) expressions can be developed (110), which do the following: (i) satisfy the external section-specific current density boundary conditions; (ii) satisfy a stable current flow continuity equation; (iii) ensure that current flow between any adjacent sections in continuous in the normal direction relative to (i.e., perpendicular to) the boundary between the two sections (i.e., satisfy internal boundary conditions); and (iv), optionally, assume that the current density value in a given direction varies linearly. Specifically, section-specific sheet current density (j) expressions can be developed that comprise equations for at least a first current density value ($j_x$) associated with a first amount of electric current flowing continuously in an x direction and a second current density value ($j_y$) associated with a second amount of electric current flowing continuously in a y direction. In one embodiment, these section-specific sheet current density (j) expressions can be developed assuming that current density varies linearly in each of the directions (i.e., that the first current density value ($j_x$) varies linearly in the x direction and that the second current density value ($j_y$) varies linearly in the y direction). To be more precise, the above mentioned stable current flow continuity equation in (ii) is:

$$\nabla \cdot j = \frac{\partial j_x}{\partial x} + \frac{\partial j_y}{\partial y} = 0, \quad (1)$$

which says that there is no net increase of current density anywhere within each section. Also, the above mentioned ensuring current density being continuous in the normal direction relative to a boundary of two adjacent sections in (iii) is that:

$$j_{section\ 1} \cdot \hat{n} = j_{section\ 2} \cdot \hat{n}, \quad (2)$$

where symbol $\hat{n}$ stands for the normal direction of the boundary.

Then, a section-specific resistance expression can be developed using the section-specific sheet current density expressions (112). To develop the section-specific resistance expression, the equations for the first current density value ($j_x$) and for the second current density value ($j_y$) that were developed at process 110 can be substituted into the following resistance equation:

$$R_n = \frac{1}{I^2} \iint\limits_{section\ n} j \cdot j r_{sh}(x, y) dx dy = \quad (3a)$$

$$\frac{1}{I^2} \iint\limits_{section\ n} (j_x^2 + j_y^2) r_{sh}(x, y) dx dy, \quad n = 1, 2, \ldots,$$

where $R_n$ is the resistance value of the $n^{th}$ section, I is a total amount of electric current flowing into and out of the contact bar, and $r_{sh}$ is a sheet resistance of the conduct bar. Sheet resistance $r_{sh}$ is equal to the resistivity of the contact bar materials ρ divided by the thickness of the first contact bar in a third (z) direction, and has a unit of Ω/square (Ω/□). In Equation (3a), j, $j_x$ and $j_y$ are two-dimensional current densities (i.e., sheet resistance densities) and have a unit of A/m. Equation (3a) says that the resistance in a given section is an integration of a product of a sheet resistance and the square of electric current densities over the given section.

Finally, the total resistance ($R_{tot}$) expression for the contact bar can be developed by adding the section-specific resistance expressions for all of the sections (114). That is, the total resistance is equal to the sum of the resistance values for all of the sections, $$R_{tot} = \sum_n R_n, \quad (3b)$$

where section-specific resistance expressions $R_1, R_2, \ldots$, are developed at process 112. The expression of $R_{tot}$ is further simplified if possible.

In the case of the first contact bar 221, processes 108-114 for developing the total resistance expression are detailed below. Referring to FIG. 7, at process 108, the following external boundary conditions for current density can be established in the x direction and the y direction for the first section 501. At the left edge 701 of the first section 501, there is no electric current flow in the x direction. That is:

$$j_x=0, x=0. \quad (4a)$$

At the top edge 702 of the first section 501, there is no electric current flow in the y direction, i.e., $$j_y=0, 0 \leq x \leq a, y=h, \quad (4b)$$

where h is the height of the first contact bar 221. Across the length a of the bottom edge 703 of the first section 501, which less than or equal to (as shown) the width of the diffusion region 250 (i.e., the fin pitch times the total number of fins), there is a uniform electric current flow in the y direction. This bottom edge 703 is the only edge where there is electric current flow into the contact bar 221. Namely, $$j_y=j_0=I/a, 0 \leq x < a, y=0, \quad (4c)$$

and the total amount of electric current entering and leaving the contact bar 221 is $I=j_0 a$. Furthermore, at process 108, the following external boundary conditions for current density can be established in the x direction and the y direction for the second section 502. At the top edge 706 of the second section 502, there is no electric current flow in the y direction, i.e., $$j_y=0, x \geq a, y=h. \quad (5a)$$

At the bottom edge 704 of the second section 502, there is no electric current flow in the y direction too (since it is outside the diffusion region 250), so $$j_y=0, x>a, y=0. \quad (5b)$$

At the right edge of 705 of the second section 502, electric current flows uniformly going out of the second section 502, meaning $$j_x=I/h, x=a+b. \quad (5c)$$

Across the boundary x=a of the first section 501 and the second section 502, the electric current flow in the x direction (the normal direction) is required to be continuous, $$j_{x,section\ 1}=j_{x,section\ 2}, x=a. \quad (6)$$

This is an internal boundary condition for the whole contact bar.

Then, at process 110, the following section-specific sheet current density expressions, which satisfy both the section-specific current density boundary conditions and the above-mentioned stable current flow continuity equation, can be developed for the first section 501 and the second section 502.

For the first section 501, a set of sheet current density expressions can be found. In particular, a set of liner expressions in terms of coordinates x and y can be easily obtained:

$$j_x(x) = \frac{Ix}{ha}, \quad j_y(y) = \frac{I}{a}\left(1 - \frac{y}{h}\right), \quad 0 \leq x \leq a, \quad 0 \leq y \leq h. \quad (7)$$

It follows from Equation (7) that $$\frac{\partial j_x}{\partial x} = \frac{I}{ha} \text{ and } \frac{\partial j_y}{\partial y} = -\frac{I}{ha},$$

i.e., an increase of electric current density in the x direction ($j_x$) comes from a corresponding decrease of electric current density in the y direction ($j_y$). Thus, current continuity equation (1) is satisfied within the first section 501. It can be easily verified that boundary conditions (4) are satisfied.

For the second section 502, sheet current density expressions are simply found to be:

$$j_x = \frac{I}{h}, j_y(y) = 0, \quad a \leq x \leq a+b, \quad 0 \leq y \leq h, \quad (8)$$

where b is the length of the second section 502.

It follows from Equation (8) that $\partial j_x/\partial x=0$ and $\partial j_y/\partial y=0$, so that current continuity equation (1) is satisfied within the second section 502. It can be easily seen that boundary conditions (5) are satisfied. The normal direction of the boundary (x=a) of the first section 501 and the second section 502 is the x direction. On the left side of the boundary (x=a), it follows from Equation (7) that $j_{x,section\ 1}=I/h$ at x=a the same as the current on the right side of the boundary given by Equation (8). Namely, the across boundary condition (6) is satisfied.

Next, at process 112, a section-specific resistance ($R_1$) expression for the first section 501 and a section-specific resistance ($R_1$) expression for the second section 502 can be developed by substituting the section-specific expressions for the first current density value ($j_x$) and for the second current density value ($j_y$) that were developed at process 110 into the above-mentioned resistance equation. For the first section 501, $$R_1 = \frac{1}{I^2}\int_{x=0}^{a}\int_{y=0}^{h}(j_x^2 + j_y^2)r_{sh}dxdy = \frac{r_{sh}}{3}\left(\frac{a}{h} + \frac{h}{a}\right).$$

For the second section 502, $$R_2 = \frac{1}{I^2}\int_{x=a}^{a+b}\int_{y=0}^{h}(j_x^2 + j_y^2)r_{sh}dxdy = \frac{r_{sh}b}{h}.$$

where b is the length of the second section 502.

Consequently, in this case, the total resistance ($R_{tot}$) expression for the first contact bar 221 developed at process 114 would be as follows:

$$R_{tot} = R_1 + R_2 = \left(\frac{1}{3}a + b\right)R_{h,ul} + \frac{R_{v,uw}}{3a}, \quad (9)$$

where $R_{h,ul}=r_{sh}/h$ is the horizontal resistance per unit length of the contact bar and has a unit of $\Omega/m$, and $R_{v,uw}=r_{sh}h$ is the vertical resistance for a unit width of the contact bar and has a unit of $\Omega$-m.

In the case of the fourth contact bar 224, processes 108-114 for developing the total resistance ($R_{tot}$) expression are detailed below. Referring to FIG. 8, the following external boundary conditions for current density can be established in the x direction and the y direction for the first section 601. At the left edge 801 of the first section 601, there is no electric current flow in the x direction. Namely, $$j_x=0, x=0. \quad (10a)$$

At the top edge 802 of the first section 601, there is no electric current flow in the y direction, so $$j_y=0, 0 \le x < a_1, y=h, \quad (10b)$$

where h is the height of the fourth contact bar 224 and $a_1$ is the length of the first section 601.

Across the bottom edge 803 of the first section 601, there is a uniform electric current flow in the y direction, i.e., $$j_y=j_0=I/W, 0 \le x \le a_1, y=0, \quad (10c)$$

and the total amount of electric current entering and leaving the fourth contact bar 224 is $I=j_0W$, where $W=a_1+b_1+b_2+a_2$ is the total length of the fourth contact bar 224 and $a_1, a_2, b_1, b_2$ are the lengths of the sections 601-604, respectively. Furthermore, at process 108, the following current density boundary conditions can be established for the third section 603. Similar to Eq. (10c), across the bottom edge 803 of the first section 601, there is a uniform electric current flow in the y direction, i.e., $$j_y=j_0=I/W, a_1 \le x \le a_1+b_1, y=0. \quad (11a)$$

At the top edge 611 of the third section 603, there is a uniform electric current flowing out in the y direction. Specifically, $$j_y = \frac{j_0(a_1 + b_1)}{b_1}, a_1 < x < a_1 + b_1, y = h. \quad (11b)$$

For the second section 602, at the right edge 805 of the second section 602, there is no electric current flow, so $$j_x=0, x=W.$$

At the top edge 806 of the second section 602, there is no electric current flow, and thus $$j_y=0, x>a_1+d, y=h,$$

where $d=b_1+b_2$ is equal to the width of the additional interconnect structure 242 and, thereby equal to the sum of the lengths $b_1$ and $b_2$ of the third and fourth sections 603 and 604, respectively. The boundary conditions for the fourth section 604 are similar to those for the third section 603. In particular, the count part of Eq. (11b) is $$j_y = \frac{j_0(a_2 + b_2)}{b_2}, a_1 + b_1 < x \le a_1 + d, y = h. \quad (12)$$

Across the boundary $x=a_1$ of the first section 601 and the third section 603, the electric current flow in the x direction (the normal direction) is required to be continuous, $$j_{x,section\ 1}=j_{x,section\ 3}, x=a_1. \quad (13a)$$

Across the boundary $x=a_1+d$ of the fourth section 604 and the second section 602, the electric current flow in the x direction (the normal direction) is required to be continuous, $$j_{x,section\ 4}=j_{x,section\ 2}, x=a_1+d. \quad (13b)$$

Across the boundary $x=a_1+b_1$ of the third section 603 and the fourth section 604, the electric current flow in the x direction (the normal direction) is required to be continuous. More specifically, the value of the electric current flow in the x direction is zero, i.e., $$j_{x,section\ 3}=j_{x,section\ 4}=0, x=a_1+b_1. \quad (13c)$$

These are internal boundary conditions for the whole contact bar.

Then, at process 110, the following section-specific sheet current density expressions, which satisfy both the section-specific current density boundary conditions and the above-mentioned stable current flow continuity equation, can be developed for the sections 601-604. It should be noted that since the entire fourth contact bar 224 is within the diffusion region 250, $j_0=I_{a1}/a_1=I_{b1}/b_1=I_{a2}/a_2=I_{b2}/b_2$. For the first section 601, a set of current expressions can be found. In particular, a set of liner expressions in terms of coordinates x and y can be easily found:

$$j_x(x) = \frac{j_0 x}{h}, j_y(y) = j_0\left(1 - \frac{y}{h}\right), 0 \le x \le a_1. \quad (14)$$

It follows from Equation (14) that $\partial j_x/\partial x=j_0/h$ and $\partial j_y/\partial y=-j_0/h$, meaning that an increase of electric current density in the x direction ($j_x$) comes from a corresponding decrease of electric current density in the y direction ($j_y$). So, current continuity equation (1) is satisfied within the first section 601. It can be easily verified that boundary conditions (10) are satisfied. For the third section 603 immediately adjacent to the first section 601, a set of current expressions can be found. In particular, a set of liner expressions in terms of coordinates x and y can be easily constructed:

$$j_x(x) = \frac{I_{a1}(a_1 + b_1 - x)}{hb_1}, j_y(y) = j_0 + \frac{I_{a1}y}{hb_1}, a_1 < x < a_1 + b_1. \quad (15)$$

It follows from Equation (15) that $\partial j_x/\partial x=-I_{a1}/hb_1$ and $\partial j_y/\partial y=I_{a1}/hb_1$, i.e., a decrease of electric current density in the x direction comes ($j_x$) becomes a corresponding increase of electric current density in the y direction ($j_y$). Thus, current continuity equation (1) is satisfied within the third section 603. It can be easily seen that boundary conditions (11) and (13c) are satisfied. At the left-hand side of the boundary $x=a_i$ of the first section 601 and the third section 603, Eq. (14) gives $j_{x,section\ 1}=j_0a_1/h$.

At the right-hand side of the boundary $x=a_1$, Eq. (15) has a value of $j_{x,section\ 3}=I_{a1}/h=j_0a_1/h$. Thus, condition (13a) is satisfied.

Essentially the same section-specific sheet current density expressions can be found for the second and fourth sections 602 and 604, respectively. As illustrated, the stable current flow continuity equation is satisfied for each of the section 601-602 separately.

Next, at process 112, a section-specific resistance ($R_1$) expression for the first section 601, a section-specific resistance ($R_2$) expression for the second section 602, a section-specific resistance ($R_3$) expression for the third section 603, and a section-specific resistance ($R_4$) expression for the fourth section 604 can be developed by substituting the section-specific expressions for the first current density value ($j_x$) and for the second current density value ($j_y$) that were developed at process 110 into the above-mentioned resistance equation. For the first section 601 and for the third section 603 immediately adjacent to the first section, $$R_1 = \frac{1}{I^2} \int_{x=0}^{a_1} \int_{y=0}^{h} (j_x^2 + j_y^2) r_{sh} \, dx \, dy, \text{ and}$$

$$R_3 = \frac{1}{I^2} \int_{x=a_1}^{a_1+b_1} \int_{y=0}^{h} (j_x^2 + j_y^2) r_{sh} \, dx \, dy,$$

respectively. Substituting sheet current density expressions (14) and (15) into the above integration expressions, it is obtained that $$R_1 + R_2 = \frac{(a_1+b_1)^2}{W^2} \left[ \frac{R_{v,uw}}{a_1+b_1} \left(1 + \frac{a_1}{3b_1}\right) + \frac{a_1^2 R_{h,ul}}{3(a_1+b_1)} \right].$$

Essentially the same resistance expressions $R_2$ and $R_4$ can be found for the second and fourth sections 602 and 604, respectively.

Consequently, in this case, the total resistance ($R_{tot}$) expression for the fourth contact bar 224 developed at process 114 would be as follows when the resistance expressions for the four sections 601-604 are combined:

$$R_{tot} =$$

$$R_1 + R_2 + R_3 + R_4 = \sum_{n=1}^{2} \frac{(a_n+b_n)^2}{W^2} \left[ \frac{R_{v,uw}}{a_n+b_n} \left(1 + \frac{a_n}{3b_n}\right) + \frac{a_n^2 R_{h,ul}}{3(a_n+b_n)} \right].$$

It should be noted that in this case, as mentioned above, the sum of $b_1$ and $b_2$ is equal to d. However, the values of $b_1$ and $b_2$ and, particularly, the boundary between $b_1$ and $b_2$ can be selectively adjusted in order to minimize the total resistance ($R_{tot}$). One choice is to have a same current density across the upper opening of width d. From Eqs. (11b) and (12), this means that $$\frac{a_1+b_1}{b_1} = \frac{a_2+b_2}{b_2}.$$

This leads to $$b_1 = \frac{a_1 d}{a_1 + a_2}$$

and $$b_2 = \frac{a_2 d}{a_1 + a_2}.$$

Consequently, the total resistance ($R_{tot}$) expression for the fourth contact bar 224 can be simplified as follows:

$$R_{tot} = R_{v,uw} \left( \frac{2}{3W} + \frac{1}{3d} \right) + \frac{R_{h,ul}(a_1^2 - a_1 a_2 + a_2^2)}{3W}. \quad (16)$$

It should be noted that in the processes 110-114 described in detail above, if multiple sets of section-specific sheet current density expressions can be developed at process 110 for a given section and these multiple sets satisfy both the section-specific current density boundary conditions and the stable current flow continuity equation, then multiple section-specific resistance expressions should be developed for that given section at process 112 using the multiple sets and the specific section-specific resistance expression that will obtain the smallest resistance value should be selected for use at process 114.

Additionally, it should be noted as described above the processes 108-114 account for electric current flow only in the x direction and y direction. However, those skilled in the art will recognize that for a more precise total resistance ($R_{tot}$) expression such processes can further take into account electric current flow in the z direction.

Finally, once closed-form total resistance ($R_{tot}$) expressions are developed for any of the contact bars 221-224 of FIG. 1 in the manner described above, they can be used in a compact model (e.g., in simulated program with integrated circuit emphasis (SPICE) netlists) because they are analytic expressions of total resistance as a function of geometry and an electric parameter (116).

Also disclosed herein are embodiments of a modeling system. The modeling system can be implemented, for example, in a computer hardware environment such as that described in detail below and depicted in FIG. 9. Specifically, the modeling system can comprise a memory that stores a design for an integrated circuit, such as a design for the integrated circuit 200 illustrated in FIG. 2 and described in detail above. The modeling system can further comprise one or more processor(s) that access the design from the memory and that perform the method steps described in detail above and set forth in the flow diagram of FIG. 1 for accurately modeling the total resistance ($R_{tot}$) of a contact bar, such as the total resistance ($R_{tot}$) of the contact bar 221 or the total resistance of the contact bar 224 of FIG. 2.

Also disclosed herein are embodiments of a computer program product associated with each of the above-described method embodiments for accurately modeling the total resistance value of a contact bar. Specifically, each computer program product embodiment can comprise a computer readable storage medium having program code embodied therewith. The program code can be executable by a computer to perform any of the above-described modeling method embodiments.

More particularly, as will be appreciated by one skilled in the art, aspects of the disclosed embodiments may be implemented as a method, a system or a program storage device (i.e., a computer program product). Accordingly, aspects of the disclosed embodiments may be implemented entirely in hardware, entirely in software (including firmware, resident software, micro-code, etc.) or in a combination of software and hardware and may generally be referred to herein as a "circuit," "module" or "system." Furthermore, aspects of the disclosed embodiments may take the form of a program storage device (i.e., a computer program product) embodied in one or more computer readable medium(s) having computer readable program code embodied thereon.

Any combination of one or more computer readable medium(s) may be utilized. The computer readable medium may be a non-transitory computer readable storage medium or computer readable signal medium. A computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described below with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
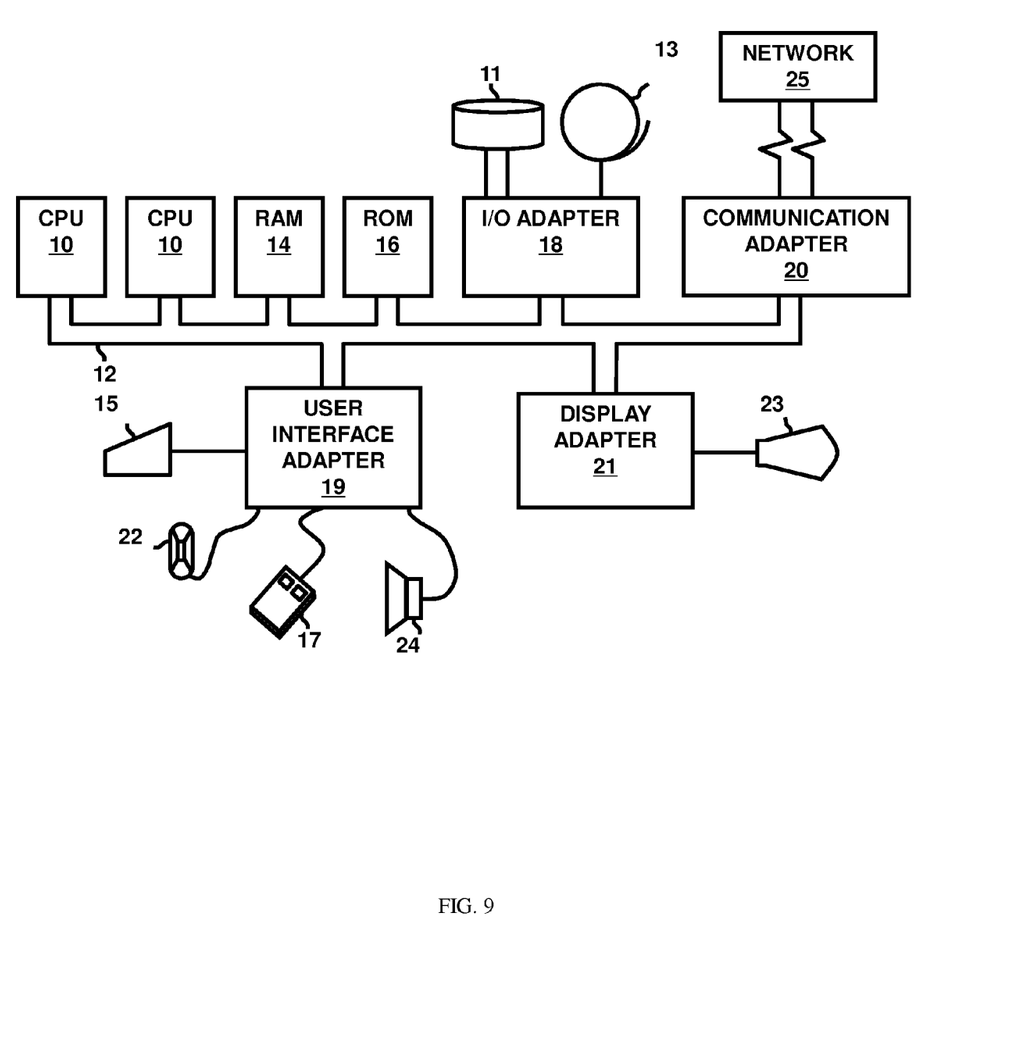
FIG. 9 is a schematic diagram illustrating an exemplary hardware environment for implementing the disclosed method, system and computer program product embodiments.

A representative hardware environment for implementing the method, system and computer program product of the disclosed embodiments is depicted in FIG. 9. This schematic drawing illustrates a hardware configuration of an information handling/computer. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the disclosed method embodiments. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the flowchart and block diagrams in the Figures illustrate the architecture, functionality, and operation of possible implementations of systems, methods and computer program products according to the disclosed embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, the descriptions of the various embodiments disclosed herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are method, system and computer program product embodiments for accurately modeling the total resistance ($R_{tot}$) of a contact bar, which traverses a diffusion region. The contact bar can be electrically connected directly to the diffusion region (e.g., in the case of an integrated circuit with planar devices, such as planar field effect transistors (FETs)) or to each of multiple semiconductor fin within the diffusion region (e.g., in the case of an integrated circuit with non-planar devices, such as multi-gate field effect transistors (MUGFETs)) and can further be electrically connected to an additional interconnect structure, such as an additional contact bar or a via or via bar. Regardless of whether the contact bar is connected to the diffusion region itself or semiconductor fins within diffusion region, in the embodiments, a closed-form expression for the total resistance ($R_{tot}$) of a contact bar is developed for use in a compact model by first demarcating sections of the contact bar depending upon the location of the additional interconnect structure on the contact bar and relative to the diffusion region. Then, for each of the sections, section-specific current density boundary conditions are established, section-specific sheet current density expressions are developed, which assume that current flow is continuous in the normal direction relative to each boundary between any two adjacent sections and which satisfy both the section-specific current density boundary conditions and a stable current flow continuity equation, and a section-specific resistance expression is developed using the section-specific sheet current density expressions. Finally, the total resistance ($R_{tot}$) expression for the contact bar is developed by adding (i.e., summing) the section-specific resistance expressions for all of the sections and this total resistance expression can be used in a compact model.

What is claimed is:

1. A modeling method comprising:
accessing, by a computer from a memory, a design for a circuit, said circuit comprising:
a diffusion region;
a contact bar electrically connected to and traversing said diffusion region; and
an additional interconnect structure electrically connected to said contact bar; and
developing, by said computer, a total resistance expression associated with said contact bar, said developing of said total resistance expression comprising:

demarcating sections of said contact bar based on a location of said additional interconnect structure on said contact bar and relative to said diffusion region;
for each of said sections, establishing section-specific current density boundary conditions, developing section-specific sheet current density expressions that satisfy both said section-specific current density boundary conditions and a stable current flow continuity equation, and developing a section-specific resistance expression using said section-specific sheet current density expressions; and
developing said total resistance expression for said contact bar by summing all section-specific resistance expressions of all of said sections.

2. The modeling method of claim 1, said circuit comprising multiple semiconductor fins in said diffusion region and said contact bar being electrically connected to said diffusion region at each of said semiconductor fins.

3. The modeling method of claim 1, said contact bar extending laterally beyond said diffusion region, said additional interconnect structure being connected to said contact bar outside said diffusion region, and said sections being demarcated so as to comprise:
a first section within said diffusion region; and
a second section outside said diffusion region.

4. The modeling method of claim 1, said section-specific sheet current density expressions being developed ensuring that electric current flow between any two adjacent sections is continuous in a normal direction relative to a boundary between said two adjacent sections.

5. The modeling method of claim 1, said section-specific sheet current density expressions comprising equations for at least the following:
a first current density value ($j_x$) associated with a first amount of current flowing continuously in an x direction; and
a second current density value ($j_y$) associated with a second amount of current flowing continuously in a y direction.

6. The modeling method of claim 5, said section-specific sheet current density expressions being developed assuming that said first current density value ($j_x$) varies linearly in said x direction and said second current density value ($j_y$) varies linearly in said y direction.

7. The modeling method of claim 5, said developing of said section-specific sheet current density expressions that satisfy both said section-specific current density boundary conditions and said stable current flow continuity equation comprising developing said section-specific sheet current density expressions such that said stable current flow continuity equation, as follows, is true for said first current density value ($j_x$) and said second current density value ($j_y$) within said section:

$$\nabla \cdot j = \frac{\partial j_x}{\partial x} + \frac{\partial j_y}{\partial y} = 0.$$

8. The modeling method of claim 5, said developing of said section-specific resistance expression comprising substituting said equations for said first current density value ($j_x$) and said second current density value ($j_y$) into the following resistance expression:

$$R_n = \frac{1}{I^2} \iint_{\text{section } n} j \cdot jr_{sh}(x,y)dxdy = \frac{1}{I^2} \iint_{\text{section } n} (j_x^2 + j_y^2)r_{sh}(x,y)dxdy,$$

where $R_n$ is a resistance value of a $n^{th}$ section, I is a total amount of current flowing into and out of said contact bar, $r_{sh}$ is a sheet resistance of current flowing in an x-y plane for said contact bar, and an integration is over said $n^{th}$ section of said contact bar.

9. The modeling method of claim 1, further comprising, when multiple sets of section-specific sheet current density expressions can be developed that satisfy both said section-specific current density boundary conditions and said stable current flow continuity equation for a given section, determining multiple section-specific resistance expressions using said multiple sets and selecting a specific one of said multiple section-specific resistance expressions that will obtain a smallest resistance value for use during said developing of said total resistance expression.

10. The modeling method of claim 1,
said contact bar being electrically connected to first source regions in said diffusion region, and
said circuit further comprising:
   a second contact bar electrically connected to second source regions in said diffusion region and extending laterally beyond said diffusion region, said additional interconnect structure comprising a third contact bar electrically connecting said contact bar to said second contact bar outside said diffusion region;
   a fourth contact bar positioned laterally between and parallel to said contact bar and said second contact bar, said fourth contact bar being electrically connected to drain regions in said diffusion region; and
   vias electrically connected to said third contact bar and said fourth contact bar.

11. The modeling method of claim 2,
said contact bar being electrically connected to first source regions in each of said semiconductor fins in said diffusion region, and
said circuit further comprising:
   a second contact bar electrically connected to second source regions in each of said semiconductor fins in said diffusion region and extending laterally beyond said diffusion region, said additional interconnect structure comprising a third contact bar electrically connecting said contact bar to said second contact bar outside said diffusion region;
   a fourth contact bar positioned laterally between and parallel to said contact bar and said second contact bar, said fourth contact bar being electrically connected to drain regions in each of said semiconductor fins in said diffusion region; and
   vias electrically connected to said third contact bar and said fourth contact bar.

12. A modeling system comprising:
a memory storing a design for a circuit, said circuit comprising:
   a diffusion region;
   a contact bar electrically connected to and traversing said diffusion region; and
   an additional interconnect structure electrically connected to said contact bar; and
at least one processor accessing said design and developing a total resistance expression associated with said contact bar by performing the following:
   demarcating sections of said contact bar based on a location of said additional interconnect structure on said contact bar and relative to said diffusion region;
   for each of said sections, establishing section-specific current density boundary conditions, developing section-specific sheet current density expressions that satisfy both said section-specific current density boundary conditions and a stable current flow continuity equation, and developing a section-specific resistance expression using said section-specific sheet current density expressions; and
   developing said total resistance expression for said contact bar by summing all section-specific resistance expressions for all of said sections.

13. The modeling system of claim 12, said circuit comprising multiple semiconductor fins in said diffusion region and said contact bar being electrically connected to said diffusion region at each of said semiconductor fins.

14. The modeling system of claim 12, said contact bar extending laterally beyond said diffusion region, said additional interconnect structure being on said contact bar outside said diffusion region, and said sections being demarcated so as to comprise:
   a first section within said diffusion region; and
   a second section outside said diffusion region.

15. The modeling method of claim 12, said section-specific sheet current density expressions being developed ensuring that electric current flow between any two adjacent sections is continuous in a normal direction relative to a boundary between said two adjacent sections.

16. The modeling system of claim 12, said section-specific sheet current density expressions comprising equations for at least the following:
   a first current density value ($j_x$) associated with a first amount of current flowing continuously in an x direction; and
   a second current density value ($j_y$) associated with a second amount of current flowing continuously in a y direction.

17. The modeling system of claim 16, said section-specific sheet current density expressions being developed assuming that said first current density value ($j_x$) varies linearly in said x direction and said second current density value ($j_y$) varies linearly in said y direction.

18. The modeling system of claim 16, said developing of said section-specific sheet current density expressions that satisfy both said section-specific current density boundary conditions and said stable current flow continuity equation comprising developing said section-specific sheet current density expressions such that said stable current flow continuity equation, as follows, is true for said first current density value ($j_x$) and said second current density value ($j_y$) within said section:

$$\nabla \cdot j = \frac{\partial j_x}{\partial x} + \frac{\partial j_y}{\partial y} = 0.$$

19. The modeling system of claim 16, said developing of said section-specific resistance expression comprising substituting said equations for said first current density value ($j_x$) and said second current density value ($j_y$) into the following resistance expression:

$$R_n = \frac{1}{I^2} \iint\limits_{\text{section } n} j \cdot jr_{sh}(x, y) dx dy = \frac{1}{I^2} \iint\limits_{\text{section } n} (j_x^2 + j_y^2) r_{sh}(x, y) dx dy,$$

where $R_n$ is a resistance value of a $n^{th}$ section, I is a total amount of current flowing into and out of said contact bar, $r_{sh}$ is a sheet resistance of current flowing in an x-y plane for said contact bar, and an integration is over said $n^{th}$ section of said contact bar.

20. The modeling system of claim 12, further comprising, when multiple sets of section-specific sheet current density expressions can be developed that satisfy both said section-specific current density boundary conditions and said stable current flow continuity equation for a given section, determining multiple section-specific resistance expressions using said multiple sets and selecting a specific one of said multiple section-specific resistance expressions that will obtain a smallest resistance value for use during said developing of said total resistance expression.

21. The modeling system of claim 12,
said contact bar being electrically connected to first source regions in said diffusion region, and
said circuit further comprising:
  a second contact bar electrically connected to second source regions in said diffusion region and extending laterally beyond said diffusion region, said additional interconnect structure comprising a third contact bar electrically connecting said contact bar to said second contact bar outside said diffusion region;
  a fourth contact bar positioned laterally between and parallel to said contact bar and said second contact bar, said fourth contact bar being electrically connected to drain regions in said diffusion region; and
  vias electrically connected to said third contact bar and said fourth contact bar.

22. The modeling system of claim 13,
said contact bar being electrically connected to first source regions in each of said semiconductor fins in said diffusion region, and
said circuit further comprising:
  a second contact bar electrically connected to second source regions in each of said semiconductor fins in said diffusion region and extending laterally beyond said diffusion region, said additional interconnect structure comprising a third contact bar electrically connecting said contact bar to said second contact bar outside said diffusion region;
  a fourth contact bar positioned laterally between and parallel to said contact bar and said second contact bar, said fourth contact bar being electrically connected to drain regions in each of said semiconductor fins in said diffusion region; and
  vias electrically connected to said third contact bar and said fourth contact bar.

23. A computer program product comprising a computer readable storage medium having program code embodied therewith, said program code being executable by a computer to perform a modeling method, said modeling method comprising:
  accessing, from a memory, a design for a circuit, said circuit comprising:
    multiple semiconductor fins in a diffusion region;
    a contact bar electrically connected to each of said semiconductor fins; and
    an additional interconnect structure electrically connected to said contact bar; and,
  developing a total resistance expression associated with said contact bar, said developing of said total resistance expression comprising:
    demarcating sections of said contact bar based on a location of said additional interconnect structure on said contact bar and relative to said diffusion region;
    for each of said sections, establishing section-specific current density boundary conditions, developing section-specific sheet current density expressions that satisfy both said section-specific current density boundary conditions and a stable current flow continuity equation, and developing a section-specific resistance expression using said section-specific sheet current density expressions; and
    developing said total resistance expression for said contact bar by summing all section-specific resistance expressions for all of said sections.

24. A modeling method comprising:
accessing, by a computer from a memory, a design for a circuit, said circuit comprising:
  a diffusion region;
  a contact bar electrically connected to said diffusion region; and
  an additional interconnect structure electrically connected to said contact bar; and
developing, by said computer, a total resistance expression associated with said contact bar, said developing of said total resistance expression comprising:
  demarcating sections of said contact bar, based on a location of said additional interconnect structure on said contact bar and relative to said diffusion region, said additional interconnect structure being within said diffusion region and said sections comprising:
    a first section on a first side of said additional interconnect structure;
    a second section on a second side of said additional interconnect structure opposite said first side;
    a third section below said additional interconnect structure and positioned laterally adjacent to said first section; and
    a fourth section below said additional interconnect structure and positioned laterally between said third section and said second section;
  for each of said sections, establishing section-specific current density boundary conditions, developing section-specific sheet current density expressions that satisfy both said section-specific current density boundary conditions and a stable current flow continuity equation, and developing a section-specific resistance expression using said section-specific sheet current density expressions; and
  developing said total resistance expression for said contact bar by summing all section-specific resistance expressions for all of said sections.

25. A modeling system comprising:
a memory storing a design for a circuit, said circuit comprising:
  a diffusion region;
  a contact bar electrically connected to said diffusion region; and
  an additional interconnect structure electrically connected to said contact bar; and
  at least one processor accessing said design and developing a total resistance expression associated with said contact bar by performing the following:

demarcating sections of said contact bar based on a location of said additional interconnect structure on said contact bar and relative to said diffusion region, said additional interconnect structure being within said diffusion region and said sections comprising:
  a first section on a first side of said additional interconnect structure;
a second section on a second side of said additional interconnect structure opposite said first side;
a third section below said additional interconnect structure and positioned laterally adjacent to said first section; and
  a fourth section below said additional interconnect structure and positioned laterally between said third section and said second section;
for each of said sections, establishing section-specific current density boundary conditions, developing section-specific sheet current density expressions that satisfy both said section-specific current density boundary conditions and a stable current flow continuity equation, and developing a section-specific resistance expression using said section-specific sheet current density expressions; and
developing said total resistance expression for said contact bar by summing all section-specific resistance expressions for all of said sections.

* * * * *